(12) United States Patent
Zhang et al.

(10) Patent No.: US 12,341,480 B2
(45) Date of Patent: Jun. 24, 2025

(54) PACKAGING STRUCTURE AND POWER AMPLIFIER

(71) Applicant: Huawei Technologies Co., Ltd., Shenzhen (CN)

(72) Inventors: Xiaomin Zhang, Dongguan (CN); Mingli Huang, Dongguan (CN); Ran Jiang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 723 days.

(21) Appl. No.: 17/570,575

(22) Filed: Jan. 7, 2022

(65) Prior Publication Data

US 2022/0131510 A1  Apr. 28, 2022

Related U.S. Application Data

(63) Continuation of application No. PCT/CN2020/100971, filed on Jul. 9, 2020.

(30) Foreign Application Priority Data

Jul. 9, 2019  (CN) .......................... 201910615283.3

(51) Int. Cl.
*H03F 3/14* (2006.01)
*H01L 23/00* (2006.01)
(Continued)

(52) U.S. Cl.
CPC ......... *H03F 3/245* (2013.01); *H01L 23/3736* (2013.01); *H01L 23/49838* (2013.01); *H01L 24/48* (2013.01); *H01L 2224/48155* (2013.01)

(58) Field of Classification Search
CPC . H03F 3/245; H03F 1/30; H03F 3/213; H03F 3/14; H03F 3/195; H03F 3/187;
(Continued)

(56) References Cited

U.S. PATENT DOCUMENTS 6,291,880 B1 * 9/2001 Ogawa ................ H01L 23/4334
257/725
6,847,112 B2  1/2005 Ito
(Continued)

FOREIGN PATENT DOCUMENTS

CN  1429683 A  7/2003
CN  1838868 A  9/2006
(Continued)

OTHER PUBLICATIONS

Chen Guangmeng, "High Frequency Circuit Fundamentals 2nd Edition," Fudan University Press, ISBN: 978-7-309-12045-5, Jan. 2016, pp. 368-369 (with English Translation).

*Primary Examiner* — Khanh V Nguyen
(74) *Attorney, Agent, or Firm* — SLATER MATSIL, LLP

(57) ABSTRACT

A packaging structure and a power amplifier, the packaging structure including a first component, a second component, a printed circuit board, and a metal plate having an etched pattern. The printed circuit board is disposed on the metal plate, and the printed circuit board has an open slot. The first component is disposed in the open slot, and the first component is disposed on the metal plate. The first component is connected to the printed circuit board, the second component is disposed on the printed circuit board, and the second component is connected to the printed circuit board.

17 Claims, 4 Drawing Sheets

(51) Int. Cl.
*H01L 23/373* (2006.01)
*H01L 23/498* (2006.01)
*H03F 3/24* (2006.01)

(58) Field of Classification Search
CPC ........... H01L 23/3736; H01L 23/49838; H01L 24/48; H01L 2224/48155; H01L 24/78; H01L 24/85; H01L 23/66; H01L 23/145; H01L 23/15; H01L 24/45; H01L 2223/6611; H01L 2223/6627; H01L 2223/6644; H01L 2223/6655; H01L 2224/45014; H01L 2224/45124; H01L 2224/45144; H01L 2224/48091; H01L 2224/48227; H01L 2224/78301; H01L 2224/85205; H01L 2224/85444; H01L 2924/00014; H01L 2924/1304; H01L 2924/15153; H01L 2924/16152; H01L 2924/19041; H01L 2924/19042; H01L 2924/19105; H01L 2924/19107; H01L 2924/30107; H01L 23/142; H01L 23/36; H01L 25/16; H01L 23/367; H01L 23/5389; H01L 24/40; H01L 2224/40091; H01L 2924/3011; H05K 1/021; H05K 1/184; H05K 3/0061; H05K 1/181; H05K 1/0237
USPC .................................................. 330/66, 307
See application file for complete search history.

(56) References Cited

U.S. PATENT DOCUMENTS

| | | | |
|---|---|---|---|
| 9,491,864 B2 | 11/2016 | Ma | |
| 9,999,165 B2 * | 6/2018 | Cho | H05K 9/0026 |
| 10,251,261 B2 * | 4/2019 | Chin | H05K 1/0263 |
| 10,347,596 B2 | 7/2019 | Huang et al. | |
| 2013/0002349 A1 | 1/2013 | Ho et al. | |
| 2018/0175802 A1 | 6/2018 | Wu et al. | |
| 2018/0190622 A1 | 7/2018 | Lin et al. | |
| 2019/0006297 A1 | 1/2019 | Gittemeier | |
| 2019/0043799 A1 * | 2/2019 | Lu | H01L 23/3121 |

FOREIGN PATENT DOCUMENTS

| | | | | |
|---|---|---|---|---|
| CN | 101415297 A | | 4/2009 | |
| CN | 101820251 A | | 9/2010 | |
| CN | 102623416 A | | 8/2012 | |
| CN | 103298257 A | | 9/2013 | |
| CN | 109065517 A | | 12/2018 | |
| EP | 1443809 A2 | | 8/2004 | |
| JP | H11176987 A | | 7/1999 | |
| JP | 2000150692 A | | 5/2000 | |
| JP | 2001210786 A | | 8/2001 | |
| JP | 2003234442 A | | 8/2003 | |
| JP | 2004241416 A | | 8/2004 | |
| JP | 2006020206 A | | 1/2006 | |
| WO | 03077317 A1 | | 9/2003 | |
| WO | WO2003077317 | * | 9/2003 | ... H01L 2224/05553 |

* cited by examiner

PACKAGING STRUCTURE AND POWER AMPLIFIER

CROSS-REFERENCE TO RELATED APPLICATIONS

This application is a continuation of International Application No. PCT/CN2020/100971, filed on Jul. 9, 2020, which claims priority to Chinese Patent Application No. 201910615283.3, filed on Jul. 9, 2019. The disclosures of the aforementioned applications are hereby incorporated by reference in their entireties.

TECHNICAL FIELD

This application relates to the field of integrated circuit technologies, and in particular, to a packaging structure and a power amplifier.

BACKGROUND

Radio base stations are widely used in various mobile communication fields. To increase a coverage area of a base station, a radio base station with high output power is needed. However, the high output power results in a relatively high temperature of a power amplifier (PA). Therefore, it is essential that the power amplifier has good heat dissipation performance. In addition, market-oriented large-scale production also raises requirements for manufacturing costs and simplification of a manufacturing technology.

In a power amplifier, a quad flat no-lead package (QFN) or a dual flat no-lead package (DFN) is used. A specific structure is that a bottom of a semiconductor die is connected to a metal plate, and the metal plate is used for heat dissipation, and the semiconductor die is connected to a pad by using a bond wire (bond wire), and the semiconductor die inputs or outputs a signal by using the pad.

In the foregoing packaging mode, a component can only be connected to the metal plate by using a semiconductor die attach technology, and some special components in the power amplifier, such as a surface mount device (surface mounting devices, SMD) using a surface mount technology (SMT), cannot be connected to the metal plate. Therefore, these components need to be independently deployed, resulting in a low integration degree of the entire power amplifier.

Therefore, a packaging structure is needed, to improve an overall integration degree of the packaging structure on the premise of ensuring heat dissipation performance.

SUMMARY

Embodiments of this application provide a packaging structure and a power amplifier, and the power amplifier has the packaging structure. A first component with high power consumption is disposed on a metal plate to facilitate heat dissipation, and a second component is disposed on a printed circuit board to effectively avoid a conductor loss. An integration degree of the entire packaging structure is improved on the premise of ensuring heat dissipation of the first component and power efficiency of the second component.

A first aspect of this application provides a packaging structure, including a first component, a second component, a printed circuit board, and a metal plate. The metal plate has an etched pattern, and the metal plate is a metal material with high thermal conductivity, such as copper or aluminum. The printed circuit board is disposed on the metal plate, and the printed circuit board has an open slot. The printed circuit board may be one or more layers of laminated printed circuit boards (PCB), and the printed circuit board is a silicon substrate, a glass substrate, or an organic substrate. The first component is disposed in the open slot, and the first component is disposed on the metal plate. The first component may be one or more transistors, and the first component may alternatively be a ceramic capacitor. The first component is connected to the printed circuit board. The second component is disposed on the printed circuit board, and the second component is connected to the printed circuit board. The second component may be one or more surface mount devices (SMDs).

In this embodiment of this application, the first component with high power consumption is disposed on the metal plate to facilitate heat dissipation, and the second component is disposed on the printed circuit board to effectively avoid a conductor loss. An integration degree of the entire packaging structure is improved on the premise of ensuring heat dissipation of the first component and power efficiency of the second component.

With reference to the first aspect, in a first possible implementation, a thickness of the metal plate is 0.07 mm to 0.5 mm.

In this embodiment of this application, the thickness of the metal plate is 0.07 mm to 0.5 mm, to facilitate etching of the metal plate, so that the metal plate has the etched pattern.

In another possible implementation, the thickness of the metal plate 105 may be 0.035 mm to 1 mm.

With reference to the first aspect and the first possible implementation of the first aspect, in a second possible implementation of the first aspect, the first component is connected to the printed circuit board by using a bond wire or a ribbon. The bond wire may be a bond wire or a ribbon, and the bond wire is used to connect the first component and the printed circuit board. Specifically, an input port or an output port of the first component is connected to a microstrip on the printed circuit board by using the bond wire.

With reference to the second possible implementation of the first aspect, in a third possible implementation of the first aspect, that the metal plate has the etched pattern includes the metal plate has a pad, and the printed circuit board is connected to the pad on the metal plate.

In this embodiment of this application, when the etched pattern on the metal plate is a pad, the first component disposed on the metal plate and the second component disposed on the printed circuit board may input or output signals by using the pad.

With reference to the third possible implementation of the first aspect, in a fourth possible implementation of the first aspect, that the metal plate has the etched pattern includes when the etched pattern includes a first microstrip circuit, the packaging structure further includes a third component, and the third component is disposed on the first microstrip circuit, and the second component is coupled to the third component.

In this embodiment of this application, the etched pattern on the metal plate may alternatively be the first microstrip circuit. When the etched pattern on the metal plate is the first microstrip circuit, the packaging structure may further include the third component, the third component may be an SMD, and the third component is disposed on the first microstrip circuit. The third component may be coupled to the second component.

With reference to the fourth possible implementation of the first aspect, in a fifth possible implementation of the first aspect, the printed circuit board includes a microstrip circuit. The first component is connected to the pad on the metal plate by using the microstrip circuit on the printed circuit board, and the first component is connected, by using the microstrip circuit on the printed circuit board, to the second component disposed on the printed circuit board.

With reference to the fifth possible implementation of the first aspect, in a sixth possible implementation of the first aspect, the packaging structure further includes a lid or a mold. The lid or the mold is disposed on the printed circuit board. The first component, the second component, and the bond wire or the ribbon are included between the lid or the mold and the printed circuit board, and the lid or the mold is configured to protect the packaging structure.

In this embodiment of this application, the lid or the mold is disposed on the printed circuit board, so that the metal plate and the printed circuit board may be effectively protected, and components such as the first component, the second component, and the bond wire that are disposed on the metal plate and the printed circuit board may be protected.

A second aspect of this application provides a power amplifier. The power amplifier includes the packaging structure according to any one of the first aspect or the possible implementations of the first aspect.

With reference to the second aspect of this application, in a first possible implementation of the second aspect of this application, the power amplifier includes a first inductor, and the first inductor is a bond wire or a ribbon. An inductance value of the first inductor is determined by a distance between the bond wire and the printed circuit board, or a distance between the ribbon and the printed circuit board.

In this embodiment of this application, the power amplifier uses the bond wire as the inductor. The bond wire has a high Q value, that is, a loss is relatively low when the bond wire is used as the inductor. Therefore, efficiency of the power amplifier is improved. The Q value is a quality factor of the inductor, and is a main parameter for measuring the inductor. The Q value is a ratio of inductive reactance of the inductor to equivalent loss resistance of the inductor when the inductor operates under an alternating current voltage of a specific frequency. A higher Q value of the inductor leads to a lower loss and higher efficiency of the inductor.

It may be learned from the foregoing technical solutions that the embodiments of this application have the following advantages. The first component with high power consumption is disposed on the metal plate to facilitate heat dissipation, and the second component is disposed on the printed circuit board to effectively avoid a conductor loss. An integration degree of the entire packaging structure is improved on the premise of ensuring heat dissipation of the first component and power efficiency of the second component.

DETAILED DESCRIPTION OF ILLUSTRATIVE EMBODIMENTS

Embodiments of this application provide a packaging structure, to improve an integration degree of the packaging structure on the premise of ensuring heat dissipation performance.

Figure 1:
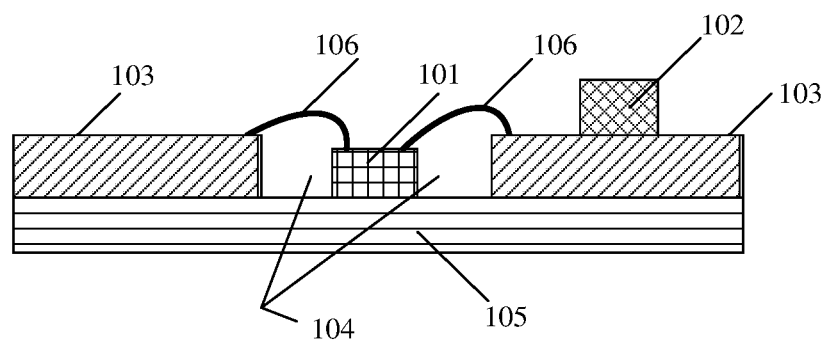
FIG. 1 is a schematic structural diagram of a packaging structure according to an embodiment of this application.

The following describes the embodiments of this application with reference to the accompanying drawings. FIG. 1 is a schematic structural diagram of a packaging structure according to an embodiment of this application. A packaging structure proposed in this application includes a first component 101, a second component 102, a printed circuit board 103, an open slot 104, a metal plate 105, and a bond wire 106.

The first component 101 may be one or more semiconductor dies, and the semiconductor die may be a transistor. When the packaging structure is applicable to a power amplifier, the first component 101 may be used as a peak transistor and/or a mean transistor.

The first component 101 may alternatively be one or more capacitors, and the capacitor may be specifically a ceramic capacitor. The ceramic capacitor has a characteristic of a small loss, and the like. The ceramic capacitor may be specifically a multilayer ceramic capacitor (MLCC). The first component 101 is connected to the metal plate 105 by using a die attach technology, or the first component 101 is connected to the metal plate 105 in a welding manner. The first component 101 is connected to the printed circuit board 103 by using the bond wire 106. Specifically, the first component 101 is connected to a microstrip on the printed circuit board 103 by using the bond wire 106. The first component 101 may be further connected to the second component 102 by using the bond wire 106.

The first component 101 is disposed in the open slot 104, the open slot 104 is disposed on the printed circuit board 103, and a bottom of the open slot 104 is the metal plate 105. It should be noted that one or more open slots 104 may be disposed on the printed circuit board 103, and one or more first components 101 are disposed in the open slot 104.

A thermally conductive adhesive may be further added between the first component 101 and the metal plate 105. The thermally conductive adhesive is applied to a surface that is of the metal plate 105 and that is to be in contact with the first component 101, to mount the first component 101 on the metal plate 105.

The second component 102 may be one or more surface mount devices (SMD). The surface mount device may be specifically a capacitor, a resistor, an inductor, or a die. When the second component 102 is a surface mount device, the second component 102 is disposed on the printed circuit board 103 by using a surface mount technology (SMT). The second component 102 is connected by using a microstrip on the printed circuit board 103. The microstrip is a microwave integrated circuit transmission line, including a metal conduction band on a dielectric substrate and a conductor ground plate on a bottom surface.

The printed circuit board 103 may be one or more layers of laminated printed circuit boards (PCBs) or laminates. A microstrip or a copper wire is disposed on the printed circuit board 103. The printed circuit board 103 is stuck to the metal plate 105 by using glue. A material of the printed circuit board 103 may be a silicon substrate, a glass substrate, or an organic substrate.

The metal plate 105 is a metal material with high thermal conductivity, such as copper or aluminum. The metal plate 105 has an etched pattern. A specific etched pattern may be a pad or another pattern, which is not limited herein. In one case, a thickness of the metal plate 105 may be 0.07 mm to 0.5 mm, to facilitate pattern etching. The thickness of the metal plate 105 is not limited herein. In another optional implementation solution, the thickness of the metal plate 105 is 0.035 mm to 1 mm.

The metal plate 105 and the printed circuit board 103 may be connected in a sticking manner, or may be connected in a welding manner, a buckle connection manner, a screw connection manner, or the like.

The bond wire 106 may be a bond wire or a ribbon, and the bond wire 106 is used to connect the first component 101 and the printed circuit board 103. Specifically, an input port or an output port of the first component 101 is connected to the microstrip on the printed circuit board 103 by using the bond wire 106.

Bonding (bond) is a wire seating manner in a die manufacturing technology. Before packaging, bonding is generally used to connect an internal circuit of a die to a package pin or a gold-plated copper foil of a circuit board by using a gold or aluminum wire. Ultrasonic waves (generally at 40 kHz to 140 kHz) from an ultrasonic generator (USG) generate high-frequency vibration in a transducer and are transmitted to a capillary by using a USG bonding head. When the capillary is in contact with a lead wire and a weldment, metal surfaces to be welded rub with each other under the action of pressure and vibration, oxide films are destroyed, and plastic deformation occurs. This causes two pure metal surfaces to come into close contact, achieving a combination at an atomic distance and finally forming a firm mechanical connection.

In this embodiment, the metal plate 105 has the etched pattern. The printed circuit board 103 is disposed on the metal plate 105, and the printed circuit board 103 has the open slot 104. The first component 101 is disposed in the open slot 104, and the first component 101 is disposed on the metal plate 105. The first component 101 is connected to the printed circuit board 103. The second component 102 is disposed on the printed circuit board 103, and the second component 102 is connected to the printed circuit board 103.

In this embodiment of this application, the first component with high power consumption is disposed on the metal plate to facilitate heat dissipation, and another component (the second component) is disposed on the printed circuit board. The second component is disposed on the printed circuit board to effectively avoid a conductor loss. The first component is connected to the printed circuit board by using the bond wire, and the first component may be connected to the outside by using the bond wire and the printed circuit board. An integration degree of the entire packaging structure is improved on the premise of ensuring power efficiency of the second component.

Figure 2:
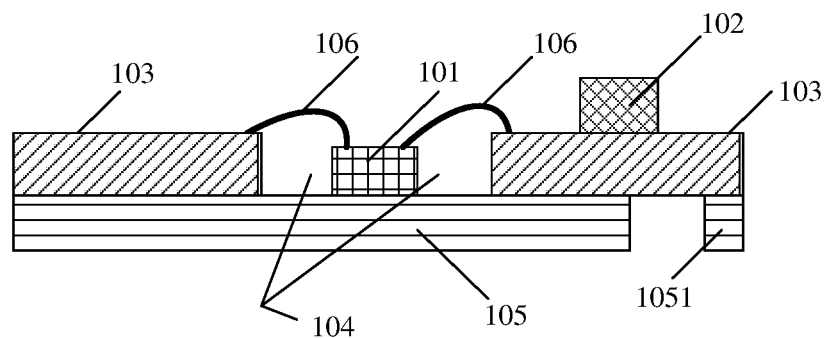
FIG. 2 is a schematic structural diagram of another packaging structure according to an embodiment of this application.

Further, because the metal plate 105 has the etched pattern, when the etched pattern is specifically a pad, refer to FIG. 2 for a specific structure of the packaging structure. FIG. 2 is a schematic structural diagram of another packaging structure according to an embodiment of this application. Based on the embodiment corresponding to FIG. 1, the another packaging structure proposed in this embodiment of this application further includes a pad 1051.

Etching is also referred to as photochemical etching, and refers to removing a protective film of a to-be-etched area after exposure and development, so that the to-be-etched area contacts with a chemical solution during etching, to achieve dissolution and corrosion, thereby forming a concave-convex or hollow-out effect. Generally, an exposure method or a silkscreen printing method may be used for etching, and a specific etching method is not limited herein.

In this embodiment, the metal plate 105 has an etched pattern after being etched, and the etched pattern may be one or more pads 1051. FIG. 2 is a schematic structural diagram when the metal plate 105 includes one pad 1051. The pad 1051 may be connected to a microstrip or a copper wire on the printed circuit board 103. The first component 101 inputs or outputs a signal by using the bond wire 106, the microstrip or the copper wire on the printed circuit board 103, and the pad 1051. The second component 102 inputs or outputs a signal by using the microstrip or the copper wire on the printed circuit board 103 and the pad 1051.

In a possible implementation, the thickness of the metal plate 105 is 0.07 mm to 0.5 mm. Therefore, the metal plate 105 is relatively easy to etch.

In this embodiment of this application, the etched pattern is formed on the metal plate through etching, and when the etched pattern is a pad, the first component may input or output a signal by using the pad. This path may be a shortest path for connecting the first component and the outside, thereby improving power efficiency of the first component. In addition, the thickness of the metal plate is controlled to be between 0.07 mm and 0.5 mm, to ensure that the metal plate is not easy to deform, and to improve convenience of etching the metal plate.

Figure 3:
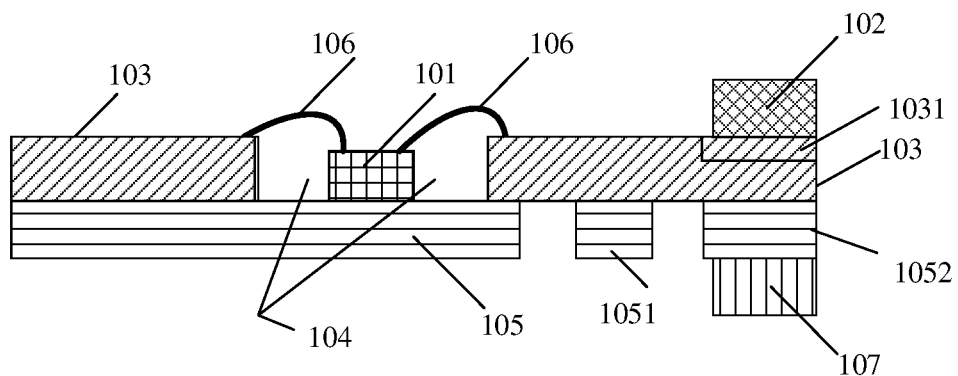
FIG. 3 is a schematic structural diagram of another packaging structure according to an embodiment of this application.

Further, because the metal plate 105 has the etched pattern, when the etched pattern is another pattern, refer to FIG. 3 for a specific structure of the packaging structure. FIG. 3 is a schematic structural diagram of another packaging structure according to an embodiment of this application. Based on the embodiment corresponding to FIG. 2, the another packaging structure proposed in this embodiment of this application further includes a first microstrip circuit 1052, a second microstrip circuit 1031, and a third component 107.

In this embodiment, the metal plate 105 has an etched pattern after being etched. When the etched pattern may be one or more first microstrip circuits 1052, a shape of the first microstrip circuit 1052 may be any shape, and one or more surface mount devices (SMD) may be mounted on a bottom surface of the first microstrip circuit 1052. When an SMD is mounted on the bottom surface of the first microstrip circuit, the third component 107 is specifically mounted on the bottom surface of the first microstrip circuit. The third component 107 may be an SMD, and a quantity of third components 107 is not limited herein.

In a possible implementation, when the etched pattern on the metal plate 105 includes the first microstrip circuit 1052, and the second microstrip circuit 1031 overlapping with the first microstrip circuit in a vertical direction exists on the printed circuit board 103, the third component 107 is disposed on the first microstrip circuit 1052, and the second microstrip circuit 1031 is connected to the second component 102. In this case, the second component 102 is connected to the second microstrip circuit 1031, the third component 107 is connected to the first microstrip circuit 1052, and the first microstrip circuit 1052 is coupled to the second microstrip circuit 1031. Therefore, the second component 102 is coupled to the third component 107 by using the second microstrip circuit 1031 and the first microstrip circuit 1052.

Figure 4:
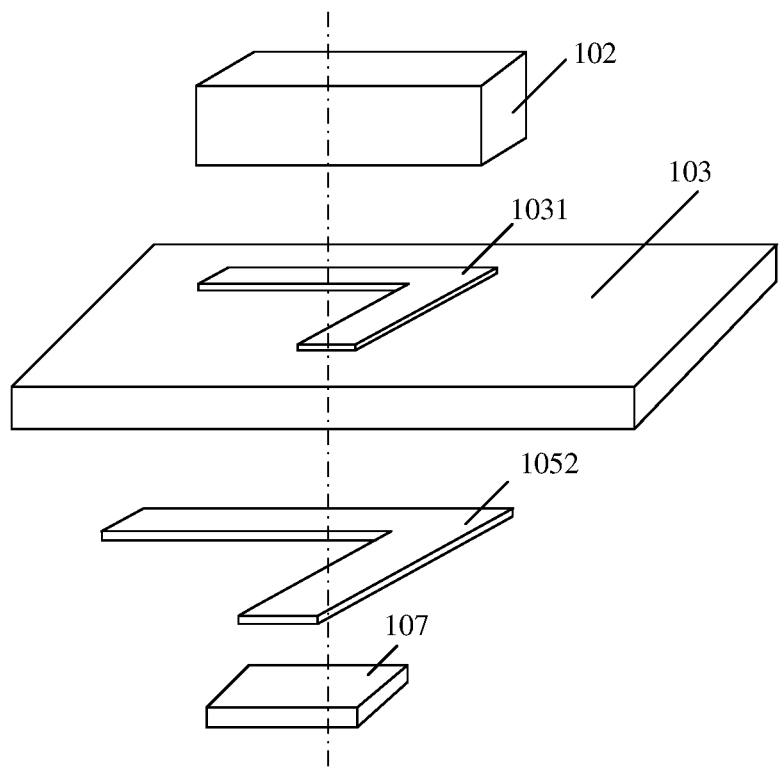
FIG. 4 is a schematic structural diagram of another packaging structure according to an embodiment of this application.

Specifically, refer to FIG. 4 for a position relationship among the second component 102, the printed circuit board 103, the second microstrip circuit 1031, the first microstrip circuit 1052, and the third component 107 in the vertical direction. FIG. 4 is a schematic structural diagram of another packaging structure according to an embodiment of this application. The second component 102, the second microstrip circuit 1031, the first microstrip circuit 1052, and the third component 107 are located on a same vertical line.

In this embodiment of this application, the etched pattern on the metal plate may alternatively be the first microstrip circuit, and the third component may be further mounted to a bottom of the first microstrip circuit, thereby improving implementation flexibility of this application.

Figure 5:
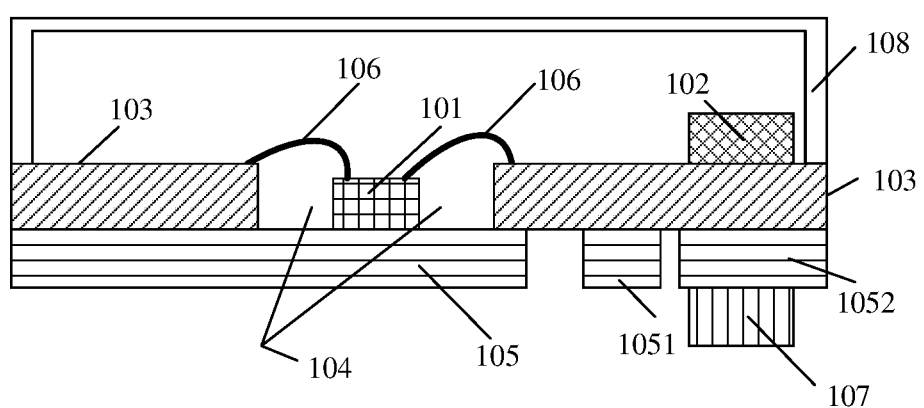
FIG. 5 is a schematic structural diagram of another packaging structure according to an embodiment of this application.

Further, because the bond wire 106 and the second component 102 on a surface of the printed circuit board 103 are relatively fragile, a lid (lid) may be further disposed on the printed circuit board 103 to protect the components. Specifically, FIG. 5 is a schematic structural diagram of another packaging structure according to an embodiment of this application. Based on the embodiment corresponding to FIG. 3, the another packaging structure proposed in this embodiment of this application further includes a lid 108.

In this embodiment, the lid 108 is disposed on the printed circuit board 103. The first component 101, the second component 102, and the bond wire 106 are included between the lid 108 and the printed circuit board 103. The lid 108 is configured to protect the packaging structure. The lid 108 may alternatively be a mold (mold), which is not limited herein.

In this embodiment of this application, the lid is disposed on the printed circuit board, to effectively protect the components, thereby improving security of the packaging structure.

Figure 6:
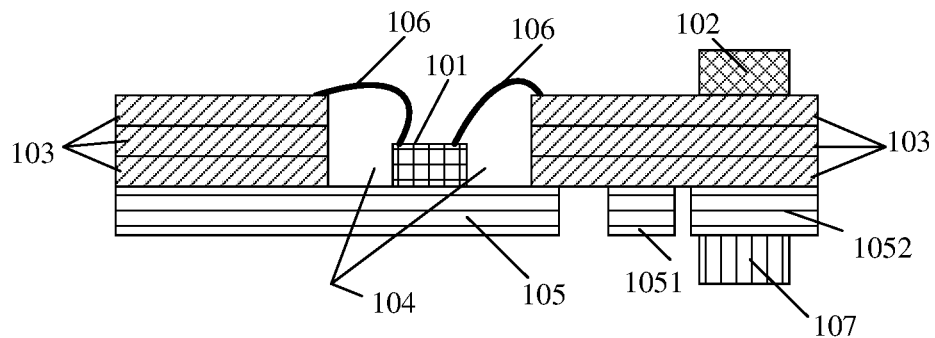
FIG. 6 is a schematic structural diagram of another packaging structure according to an embodiment of this application.

Further, based on the foregoing embodiment, refer to FIG. 6 for a case in which the printed circuit board has a plurality of layers. FIG. 6 is a schematic structural diagram of another packaging structure according to an embodiment of this application. In the another packaging structure proposed in this embodiment of this application, the printed circuit board 103 may be a three-layer structure. It should be noted that a quantity of PCB layers of the printed circuit board is not limited herein. Specifically, in the packaging structure proposed in this embodiment of this application, the quantity of layers of the printed circuit board may be 2, 4, 6, 8, 10, 12, 14, or the like.

In this embodiment of this application, if the printed circuit board has more layers, an electronic circuit can obtain greater cabling space. Therefore, fine and tight cabling lines may have an optimal layout, thereby effectively reducing electromagnetic interference and other unstable factors. In addition, the quantity of PCB layers of the printed circuit board is increased so that on the premise of ensuring normal performance of the packaging structure, an overall volume of the packaging structure is reduced, and costs of the packaging structure are reduced.

Based on the embodiments corresponding to FIG. 1 to FIG. 6, this application further proposes a power amplifier, and the power amplifier uses the packaging structure in the foregoing embodiments. A mean transistor and a peak transistor in the power amplifier may be implemented by using the first component 101, the second component 102, the third component 107, or the like in the foregoing embodiments.

Figure 7:
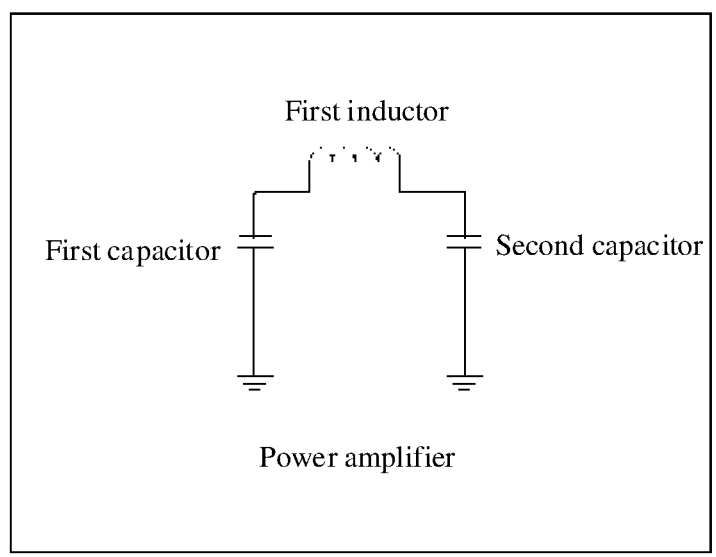
FIG. 7 is a schematic circuit diagram according to an embodiment of this application.
Figure 8:
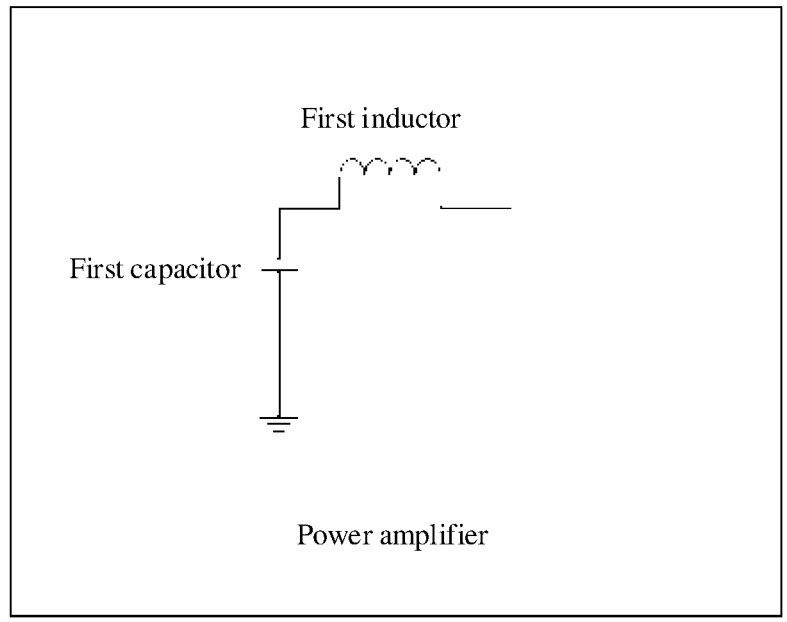
FIG. 8 is another schematic circuit diagram according to an embodiment of this application.

In an optional implementation, a quarter wavelength transmission line in the power amplifier may be implemented by using a circuit shown in FIG. 7 or FIG. 8. Specifically, FIG. 7 is a schematic circuit diagram according to an embodiment of this application. FIG. 8 is another schematic circuit diagram according to an embodiment of this application.

In FIG. 7, the power amplifier further includes a first inductor, a first capacitor, and a second capacitor. The first inductor is connected to the first capacitor, the first inductor is connected to the second capacitor, and this part of circuit is used as the quarter wavelength transmission line in the power amplifier. The first capacitor and the second capacitor may be implemented by using the first component, the second component, or the third component in the foregoing packaging structure. The first inductor may be implemented by using the bond wire in the foregoing packaging structure, or may be implemented by using the ribbon in the foregoing packaging structure. This is not limited herein.

In FIG. 8, the power amplifier further includes a first inductor and a first capacitor. The first inductor is connected to the first capacitor, and this part circuit is used as the quarter wavelength transmission line in the power amplifier. The first capacitor may be implemented by using the first component, the second component, or the third component in the foregoing packaging structure. The first inductor may be implemented by using the bond wire in the foregoing packaging structure, or may be implemented by using the ribbon in the foregoing packaging structure. This is not limited herein.

Figure 9:
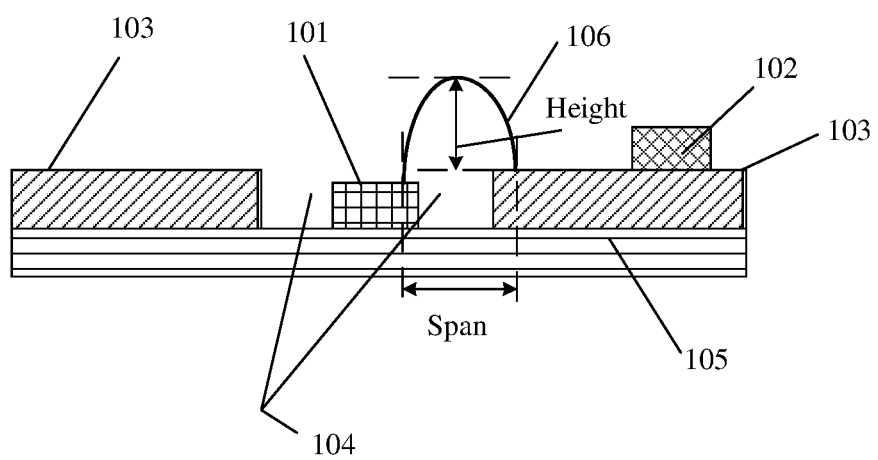
FIG. 9 is a schematic structural diagram of a power amplifier according to an embodiment of this application.

Specifically, an inductance value of the first inductor is determined by a height difference between the bond wire and the printed circuit board, a span of the bond wire, a quantity of bond wires, or a distance between the bond wires. Alternatively, an inductance value of the first inductor is determined by a height difference between the ribbon and the printed circuit board, a span of the ribbon, a quantity of ribbons, or a distance between the ribbons. FIG. 9 is a schematic structural diagram of a power amplifier according to an embodiment of this application. The height difference between the bond wire or the ribbon and the printed circuit board is a vertical distance between a top of the bond wire or the ribbon and the printed circuit board. The span of the bond wire or the ribbon is a distance between two ends of the bond wire or the ribbon.

In this embodiment of this application, the power amplifier uses the bond wire as the inductor. The bond wire has a high Q value, that is, a loss is relatively low when the bond wire is used as the inductor. Therefore, efficiency of the power amplifier is improved. The Q value is a quality factor of the inductor, and is a main parameter for measuring the inductor. The Q value is a ratio of inductive reactance of the inductor to equivalent loss resistance of the inductor when the inductor operates under an alternating current voltage of a specific frequency. A higher Q value of the inductor leads to a lower loss and higher efficiency of the inductor.

The packaging structure and the power amplifier in the embodiments of this application are described in detail above. The principle and implementation of this application are described herein through specific examples in the specification. The descriptions about the embodiments of this application are merely provided to help understand the method and core ideas of this application. In addition, a person of ordinary skill in the art can make variations and modifications to this application in terms of the specific implementations and application scopes according to the ideas of this application. Therefore, the content of specification shall not be construed as a limitation to this application.

What is claimed is:

1. A packaging structure, comprising:
   a first component;
   a second component;
   a printed circuit board;
   a third component and
   a metal plate having an etched pattern;
   wherein the printed circuit board is disposed on the metal plate, and the printed circuit board has an open slot;
   wherein the first component is disposed in the open slot, and the first component is disposed on the metal plate;
   wherein the first component is connected to the printed circuit board; and
   wherein the second component is disposed on the printed circuit board, and the second component is connected to the printed circuit board;
   wherein the etched pattern comprises a first microstrip circuit, wherein the third component is disposed on, and connected to, the first microstrip circuit.

2. The packaging structure according to claim 1, wherein a thickness of the metal plate is 0.07 mm to 0.5 mm.

3. The packaging structure according to claim 1, wherein a thickness of the metal plate is 0.035 mm to 1 mm.

4. The packaging structure according to claim 1, wherein the first component is connected to the printed circuit board by using a bond wire or a ribbon.

5. The packaging structure according to claim 4, wherein the etched pattern is a pad; and
   wherein the printed circuit board is connected to the pad of the metal plate.

6. The packaging structure according to claim 5, wherein the printed circuit board comprises a second microstrip circuit;
   wherein the first component is connected to the pad on the metal plate by the second microstrip circuit of the printed circuit board; and
   wherein the first component is connected, by the second microstrip circuit of the printed circuit board, to the second component disposed on the printed circuit board.

7. The packaging structure according to claim 6, wherein the third component is coupled, by the first microstrip circuit, to the second component connected to the second microstrip circuit.

8. The packaging structure according to claim 7, wherein the packaging structure further comprises a lid or a mold;
   wherein the lid or the mold is disposed on the printed circuit board; and
   wherein the first component, the second component, and the bond wire or the ribbon are disposed between the printed circuit board and the lid or the mold.

9. The packaging structure according to claim 1, wherein the first component is at least one of one or more semiconductor dies or one or more ceramic capacitors.

10. The packaging structure according to claim 1, wherein the first component is a capacitor.

11. The packaging structure according to claim 1, wherein the second component is one or more surface mount devices.

12. The packaging structure according to claim 1, wherein the printed circuit board comprises one or more layers of laminated printed circuit boards.

13. The packaging structure according to claim 12, wherein the printed circuit board is at least one of a silicon substrate, a glass substrate, or an organic substrate.

14. The packaging structure according to claim 1, wherein the metal plate is a metal material with high thermal conductivity.

15. A power amplifier, comprising:
    a packaging structure, comprising:
      a first component;
      a second component;
      a printed circuit board;
      a third component; and
      a metal plate, having an etched pattern;
    wherein the printed circuit board is disposed on the metal plate, and the printed circuit board has an open slot;
    wherein the first component is disposed in the open slot, and the first component is disposed on the metal plate;
    wherein the first component is connected to the printed circuit board; and
    wherein the second component is disposed on the printed circuit board, and the second component is connected to the printed circuit board;
    wherein the etched pattern comprises a first microstrip circuit, wherein the third component is disposed on, and connected to, the first microstrip circuit.

16. The power amplifier according to claim 15, wherein the power amplifier comprises a first inductor; and
    wherein the first inductor is a bond wire or a ribbon.

17. The power amplifier according to claim 16, wherein an inductance value of the first inductor is associated with at least one of a height difference between the bond wire and the printed circuit board, a span of the bond wire, a quantity of bond wires, a distance between the bond wires, a height difference between the ribbon and the printed circuit board, a span of the ribbon, a quantity of ribbons, or a distance between ribbons.

* * * * *